US012649969B2

(12) United States Patent
Jeong et al.

(10) Patent No.: US 12,649,969 B2
(45) Date of Patent: Jun. 9, 2026

(54) METHOD FOR SEASONING A CHAMBER

(71) Applicant: ASM IP Holding B.V., Almere (NL)

(72) Inventors: YongWoong Jeong, Hwaseong-si (KR);
HakJoo Lee, Hwaseong-si (KR);
KiKang Kim, Yongin-si (KR);
JongHyun Ahn, Hwaseong-si (KR);
YoungMin Kim, Hwaseong-si (KR);
YoungSim Kim, Seongnam-Si (KR)

(73) Assignee: ASM IP Holding B.V., Almere (NL)

( * ) Notice: Subject to any disclaimer, the term of this
patent is extended or adjusted under 35
U.S.C. 154(b) by 808 days.

(21) Appl. No.: 17/896,340

(22) Filed: Aug. 26, 2022

(65) Prior Publication Data

US 2023/0070340 A1 Mar. 9, 2023

Related U.S. Application Data

(60) Provisional application No. 63/239,028, filed on Aug.
31, 2021.

(51) Int. Cl.
| | |
|---|---|
| *C23C 16/34* | (2006.01) |
| *C23C 16/40* | (2006.01) |
| *C23C 16/44* | (2006.01) |
| *C23C 16/455* | (2006.01) |
| *C23C 16/46* | (2006.01) |
| *C23C 16/505* | (2006.01) |

(52) U.S. Cl.
CPC ...... *C23C 16/4404* (2013.01); *C23C 16/4405*
(2013.01); *C23C 16/45542* (2013.01); *C23C*

*16/46* (2013.01); *C23C 16/505* (2013.01);
*C23C 16/345* (2013.01); *C23C 16/401*
(2013.01)

(58) Field of Classification Search
None
See application file for complete search history.

(56) References Cited

U.S. PATENT DOCUMENTS

| | | | | |
|---|---|---|---|---|
| 2013/0213434 A1* | 8/2013 | Wang | ............ | C23C 16/56 |
| | | | | 134/1.2 |
| 2014/0272184 A1* | 9/2014 | Sreekala | ............ | C23C 16/4405 |
| | | | | 427/534 |
| 2015/0147482 A1* | 5/2015 | Kang | ............ | C23C 16/4404 |
| | | | | 427/535 |
| 2019/0382889 A1* | 12/2019 | Parimi | ............ | C23C 16/50 |

FOREIGN PATENT DOCUMENTS

| | | | | |
|---|---|---|---|---|
| EP | 648860 A1 * | 4/1995 | ............ | C23C 16/42 |

\* cited by examiner

*Primary Examiner* — Jose I Hernandez-Kenney
(74) *Attorney, Agent, or Firm* — Snell & Wilmer L.L.P.

(57) ABSTRACT

Provided is a method for seasoning a reactor in which a dry
cleaning step and a first seasoning step are carried out at the
first temperature, then the temperature is raised to a second
temperature. The method also comprises a second seasoning
step and a substrate processing step are carried out at the
second temperature. The seasoning step of the disclosure
suppresses dry cleaning byproducts from evaporating,
spreading and re-spreading in a reactor. Thus, deterioration
of the film quality deposited on a substrate is prevented,
extending the wet etch cycle of the reactor and improving
the uptime and the efficiency of the reactor.

19 Claims, 3 Drawing Sheets

PRIOR ART (a)            (b)

PRIOR ART

METHOD FOR SEASONING A CHAMBER

CROSS-REFERENCE TO RELATED APPLICATIONS

This application claims priority to U.S. Provisional Patent Application Ser. No. 63/239,028 filed Aug. 31, 2021 titled METHOD FOR SEASONING A CHAMBER, the disclosure of which is hereby incorporated by reference in its entirety.

BACKGROUND

Technical Field

The disclosure relates to a maintenance of a semiconductor deposition apparatus, and more particularly relates to depositing a film on the inner surface of the reactor of the apparatus.

Description of the Related Arts

In the semiconductor deposition apparatus, chemicals are supplied periodically to a reactor to deposit a film on the surface of the substrate. When the film is deposited on the substrate, the film is also deposited on an inner surface of the reactor. But the film deposited on the inner surface of the reactor releases particles that deteriorates the quality of the film deposited on the substrate. Therefore, the film deposited to the inner surface of the reactor is periodically removed and the inner surface of the reactor is cleaned in order to prevent deterioration of the film quality and to maintain the reproducibility of the process.

The cleaning of the reactor is carried out by supplying a cleaning gas to the reactor to chemically react with the film deposited on the inner surface of the reactor and remove it, i.e., a dry cleaning. Or the reactor may be disassembled and cleaned with liquid chemicals to remove the film deposited on the parts constituting the reactor, i.e., a wet cleaning.

After the reactor is cleaned, a gas is supplied to the reactor to deposit a certain thickness of the film on the inner surface of the reactor without a substrate loaded into the reactor. This process is referred to as a precoating or a seasoning, which creates an environment for a process in the reactor before processing the substrate (referred to as seasoning hereinafter). For instance, the film deposited on the inner surface of the reactor during a seasoning process may have the same quality as that of the film deposited on the substrate during a normal process. FIG. 1 illustrates a conventional dry cleaning and a seasoning process.

In FIG. 1, after a reactor processed a certain number of substrates S1, a cleaning gas is supplied to the reactor without a substrate loaded into the reactor at a first temperature T1 to carry out a dry cleaning step S2. The cleaning gas in the reactor chemically reacts with a film deposited on the inner surface of the reactor during a film removal step S3.

After removing the film, a seasoning step S4 is carried out. During the seasoning step S4, a seasoning film is deposited on the inner surface of the reactor by supplying a source gas and a reactant at a second temperature T2. The source gas and the reactant supplied to the inner surface of the reactor to form a seasoning film thereon may be the same as a gas supplied to form a film on the substrate during a substrate processing step S6.

When the seasoning film formed on the surface of the substrate reached the target thickness (S5), then a substrate is loaded to the reactor and a substrate processing step S6 starts.

In FIG. 1, the dry cleaning step S2 and the film removal step S3 may be carried out at the first temperature T1, the seasoning step S4 and a substrate processing step S6 may be carried out at the second temperature T2. The cleaning gas may be more active at the first temperature T1. The first temperature T1 may be lower than the second temperature T2, and the second temperature T2 may be a substrate processing temperature. The first temperature T1 may be within the range of 325° C. to 375° C. and the second temperature T2 may be within the range of 425° C. to 475° C.

However, cleaning byproducts generated during the dry cleaning step S2 and the film removal step S3 deteriorate the efficiency of substrate processing process after the seasoning step S4. For instance, when the reactor made of aluminum is dry cleaned with $NF_3$ gas, the reactor body chemically reacts with $NF_3$ gas and generates trifluoride aluminum ($AlF_3$). $AlF_3$ is a cleaning byproduct and acts as an impurity in substrate processing process. For instance, $AlF_3$ diffuses into and throughout the reaction space, deteriorates a reproducibility of wet etch rate (WER) of a film deposited on a substrate, reduces a cleaning cycle and lowers a productivity and an operating efficiency of a substrate processing apparatus.

FIG. 2 illustrates a trend of wet etch rate (WER) of a film deposited on a substrate in accordance with an accumulated number of processed substrates when depositing SiN film on a substrate by plasma enhanced atomic layer deposition. In FIG. 2, 'A' may represent an accumulated thickness of a film deposited on substrates and 'B' may refer to dry cleaning and seasoning cycles. For instance, 'A' may be 1.2 um and 'B' may be a dry cleaning or a seasoning step in accordance with FIG. 1. That is, in FIG. 2, a dry cleaning and a seasoning step may be carried out whenever the accumulated thickness of a film reaches 1.2 um.

During a dry cleaning step, a fluorine-containing gas, such as $NF_3$, $ClF_3$, or $F_2$, may be supplied as a cleaning gas. During a seasoning step, a source gas and a reactant may be supplied to deposit a film on the inner surface of a reactor. During a dry cleaning step or a seasoning step, at least one of cleaning gas, source gas, or a reactant may be activated by RF power. During a seasoning step, nitrogen-containing gas such as $NH_3$ may be supplied to remove $AlF_3$ cleaning byproducts. Or nitrogen-containing gas may be activated by RF power to promote a chemical reaction with $AlF_3$ to remove $AlF_3$ more efficiently.

As shown in FIG. 2, however, in general, the more the number of processed substrates increases, the harder it is to keep consistent the wet etch rate of the film formed on the substrate due to the accumulation of cleaning byproducts such as $AlF_3$ in the reactor despite of periodical dry cleaning and seasoning process (D, D'). Thus, the reactor may be disassembled and wet cleaning of parts constituting the reactor may be carried out accordingly. The wet cleaning process may be carried out after lowering of temperature of the reactor, disassembly of the reactor, wet cleaning, change of parts constituting the reactor, reassembly of the reactor, raising the temperature of the reactor, and seasoning. But it takes a lot of time to carry out this procedure, leading to low uptime of the reactor, low efficiency of operation, and low productivity.

SUMMARY

The present disclosure provides a method of seasoning process for suppressing cleaning byproducts from evaporating and diffusing in a reactor.

In one or more embodiments, the seasoning process may include a dry cleaning step, a first seasoning step, a second seasoning step and a substrate processing step.

In one or more embodiments, the dry cleaning step and the first seasoning step may be carried out at the first temperature, and the second seasoning step and the substrate processing step may be carried out at the second temperature.

In one or more embodiments, in the dry cleaning step, a film deposited on the inner surface of the reactor may be removed by supplying a cleaning gas. And in the first seasoning process, a first seasoning film may be deposited on the inner surface of the reactor by plasma atomic layer deposition, and in the second seasoning step, a second seasoning film may be deposited on the first seasoning film by plasma atomic layer deposition.

In one or more embodiments, the first seasoning step may be cyclically repeated multiple times until the thickness of the first seasoning film reaches the total thickness of the first seasoning film and the second seasoning film. The second seasoning step may be cyclically repeated multiple times until the thickness of the second seasoning film reaches the total thickness of the first seasoning film and the second seasoning film.

In one or embodiments, the seasoning steps of the disclosure may suppress cleaning byproducts from evaporating and spreading in the reactor. Thus, a wet etch rate of a film deposited on a substrate during the substrate processing step may be maintained within a target range of the wet etch rate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE DISCLOSURE

The disclosure provides a method for solving the above-mentioned problem, and more particularly provides a method for controlling cleaning byproducts more effectively to prevent them from affecting substrate processing in order to maintain a wet etch rate of a film deposited on a substrate, to extend the wet etch cleaning cycle of a reactor, to increase the uptime of a reactor, and to improve an operation efficiency of a reactor.

Figure 3:
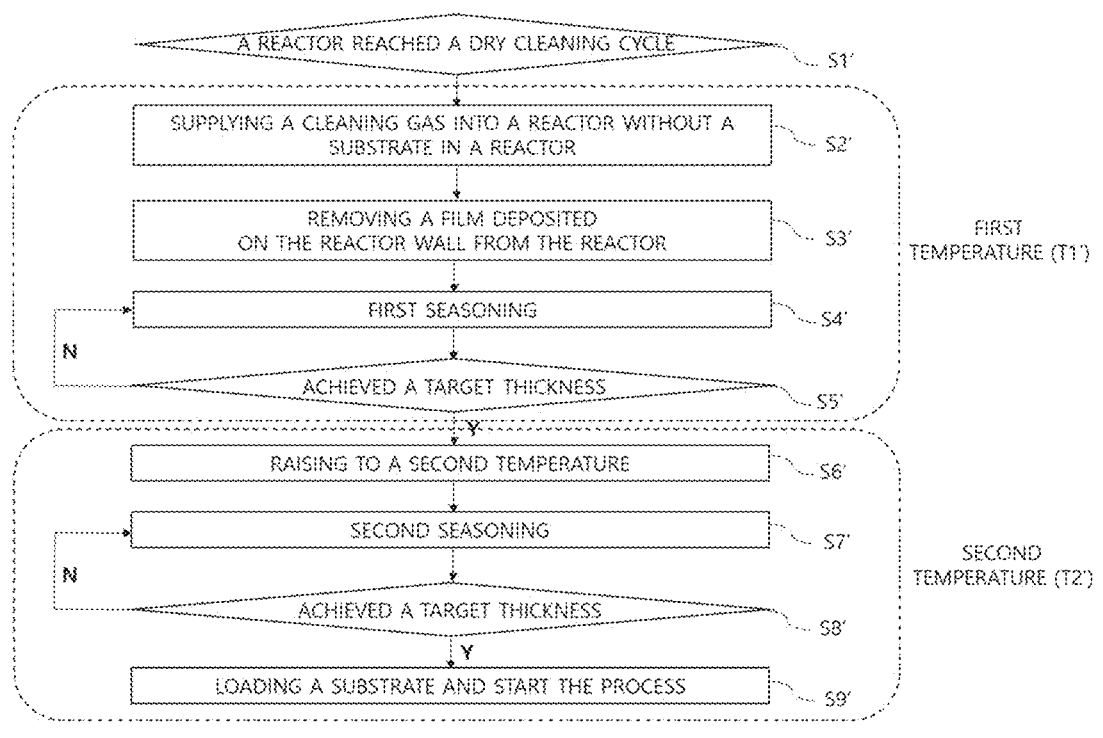
FIG. 3 is a flow chart of a dry cleaning and a seasoning process according to an embodiment of the invention.

FIG. 3 is a flow chart of a dry cleaning and a seasoning process according to an embodiment of the disclosure. In FIG. 3, when a reactor reaches a dry cleaning cycle at a step S1', a cleaning gas may be supplied to the reactor without a substrate loaded into the reactor during a dry cleaning step S2'. During the dry cleaning step S2', a fluorine-containing gas, such as $NF_3$, $ClF_3$, or $F_2$, may be supplied as a cleaning gas. The cleaning gas in the reactor may chemically react with a film deposited on the inner surface of the during a film removal step S3'.

After removing the film, a first seasoning step S4' may be carried out in which a first seasoning film may be deposited on the inner surface of the reactor by supplying a source gas and a reactant. The source gas and the reactant may be the same gas as the gas supplied to form a film on the substrate during a normal substrate processing process. The first seasoning step S4' may be repeated 'M' times until the first seasoning film deposited on the inner surface of the reactor achieved a target thickness S5'. The steps S2' to S5' may be carried out at a first temperature T1'.

In FIG. 3, the reactor does not have a substrate loaded within it during the dry cleaning process S2'. The cleaning gas chemically reacts with a film deposited on the inner surface of the reactor during the film removal step S3' at a first temperature T1'. The cleaning gas may be chemically active the most at a first temperature T1', but the first temperature T1' may be lower than the second temperature T2'. In one embodiment, the first temperature T1' may be the heating temperature of a heating block. The cleaning gas may be activated in-situ or remotely by RF power.

After the film deposited on the inner surface of the reactor is removed by the cleaning gas, a first seasoning step S4' is carried out. In the first seasoning step S4', a first seasoning film is deposited on the inner surface of the reactor by supplying a source gas and a reactant.

In one embodiment of the disclosure, the source gas and the reactant supplied during the first seasoning step S4' may be the same gas as those supplied to the substrate to form a film thereon during a substrate processing step S9. For instance, the source gas may be a Si-containing gas, such as aminosilane, iodosilane, silicon halide, or a combination of the foregoing, may be supplied. The reactant may be nitrogen-containing gas, such as $NH_3$ or $N_2$, or oxygen-containing gas, such as $O_2$, $N_2O$, or $NO_2$. Thus, the first seasoning film deposited during the first seasoning step S4' may be at least one of a SiN or $SiO_2$ film. In another embodiment at least one of the source gas or the reactant may be activated in-situ or remotely by RF power.

The first seasoning film may be deposited on the inner surface of the reactor during the first seasoning step S4'. The thickness of the first seasoning film may be 80% of the total film thickness. The total film thickness may be a sum of the thicknesses of the first seasoning film and the second seasoning film that is formed during the second seasoning process as described later, thus the first seasoning process S4' may be repeated 'M' times until the first seasoning film achieved a target thickness S5'. The steps S2' to S5' may be carried out at the first temperature T1'. The first temperature T1' may be within the range of 325° C. to 375° C.

After the first seasoning step S4' is completed at the first temperature T1', the temperature of the reactor goes up to the second temperature T2' during a heating step S6'. The second temperature T2' may be within the rage of 425° C. to 475° C. In one embodiment, the second temperature T2' may be the heating temperature of a heating block. Then the second seasoning step S7' is carried out.

During the second seasoning step S7', the second seasoning film may be deposited on the inner surface of the reactor by supplying a source gas and a reactant. The source gas and the reactant supplied during the second seasoning process may be the same as those supplied during the first seasoning step S4' and the substrate processing step S9. For instance, the source gas may be a Si-containing gas, such as aminosilane, iodosilane, silicon halide, or a combination of the foregoing. The reactant may be nitrogen-containing gas such as $NH_3$ or $N_2$, or oxygen-containing gas, such as $O_2$, $N_2O$, or $NO_2$. Thus, the second seasoning film deposited during the second seasoning step S7' may be a SiN or $SiO_2$ film. In another embodiment, at least one of the source gas or the reactant may be activated in-situ or remotely by RF power. In another embodiment, the source gas and the reactant supplied during the second seasoning step S7' may differ from those supplied during the first seasoning step S4' and the substrate processing step S9'.

The thickness of the second seasoning film may be 20% of the total film thickness. The total film thickness may be a sum of the thicknesses of the first seasoning film and the second seasoning film, thus the second seasoning step S7' may be repeated 'N' times until the second seasoning film achieved a target thickness S8'. The steps S6' to S8' may be carried out at the second temperature T2'.

After the second seasoning step S7' is completed, a substrate is loaded onto the heating block and a substrate processing step S9' starts at the second temperature T2'. In other words, the second seasoning step S7' and the substrate processing step S9' are carried out at the second temperature T2'. In one embodiment, the first temperature T1' may be within the range of 325° C. to 375° C. and the second temperature T2' may be within the range of 425° C. to 475° C.

Figure 4:
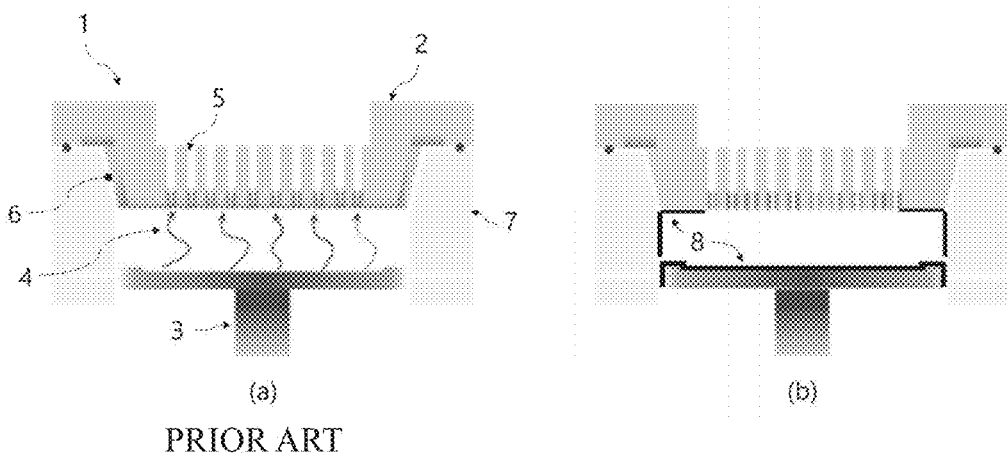
FIG. 4 is a cross-sectional view of a seasoning process carried out in a reactor in accordance with a conventional seasoning process and a seasoning process of the disclosure.

FIG. 4 illustrates seasoning steps. FIG. 4($a$) illustrates a conventional seasoning step according to FIG. 1. FIG. 4($b$) illustrates a seasoning step of the disclosure according to FIG. 3.

In FIG. 4($a$), a dry cleaning process is carried out in a reactor 1 at a first temperature T1 by supplying $NF_3$ as a cleaning gas. After the dry cleaning process, the temperature is raised to a second temperature T2 and a seasoning process is carried out. But during raising the temperature from the first temperature T1 to the second temperature T2, cleaning byproducts 4, e.g. $AlF_3$, remaining on the inner surface of a reactor 1 such as heating block 3 and a reactor wall 7 evaporate and spread within the reactor 1. For example, cleaning byproducts may spread to a plurality of gas injection holes 5 of a gas injection unit 2, or a plurality of blind spots 6 in the reactor 1 and may spread again to the substrate as impurities in the subsequent substrate processing process.

In contrast, in FIG. 4($b$), a dry cleaning is carried out at a first temperature T1' by supplying $NF_3$ as a cleaning gas and a first seasoning step is carried out at the first temperature T1' without raising the temperature, then the temperature is raised to a second temperature T2' and a second seasoning step is carried out.

In a seasoning process of FIG. 4($b$), after the dry cleaning step, a first seasoning film 8 is deposited on the inner surface of the reactor 1 during the first seasoning step and covers cleaning byproducts. Thus, a seasoning step according to FIG. 4($b$) has a technical advantage of suppressing cleaning byproducts from evaporating and spreading in a reactor and further preventing them from spreading again to the reaction space and acting as impurities in a substrate during a substrate processing step.

Figure 1:
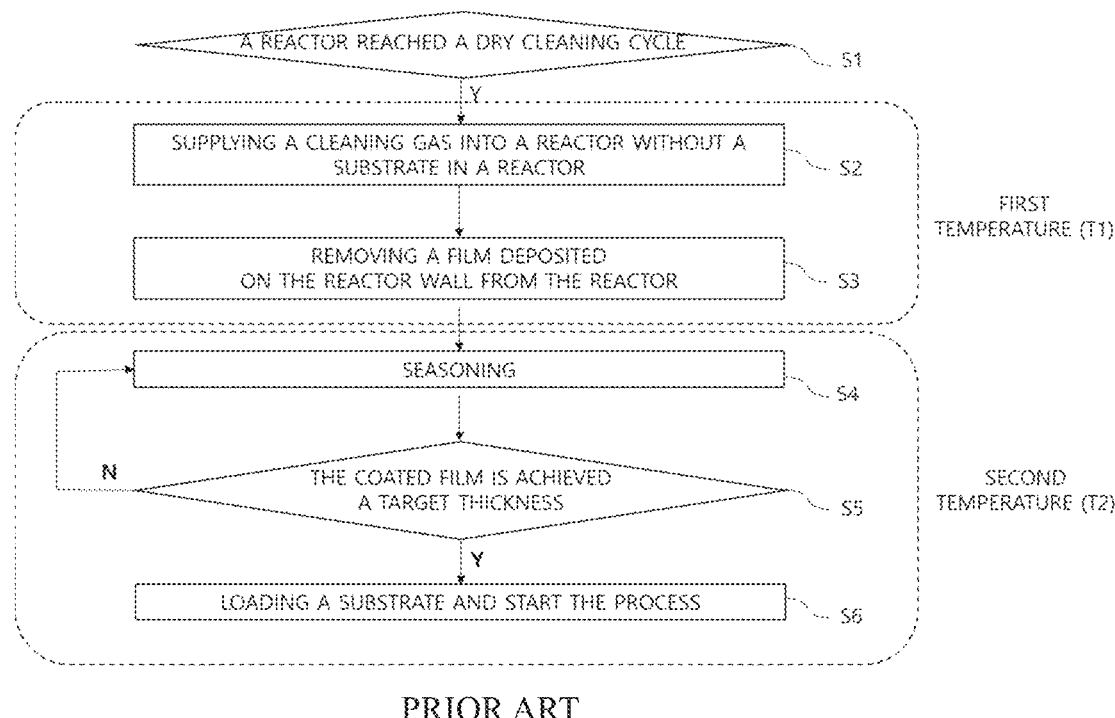
FIG. 1 is a view of a conventional dry cleaning and a seasoning process flow.
Figure 2:
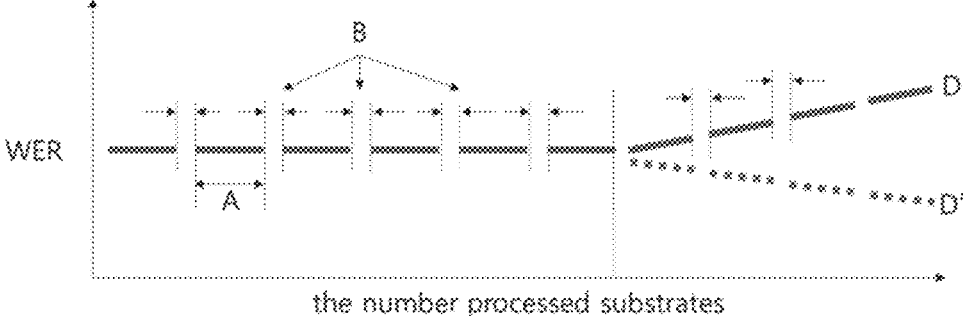
FIG. 2 is a graph showing a trend of a wet etch rate in accordance with the number of processed substrates in SiN film deposition process.
Figure 5:
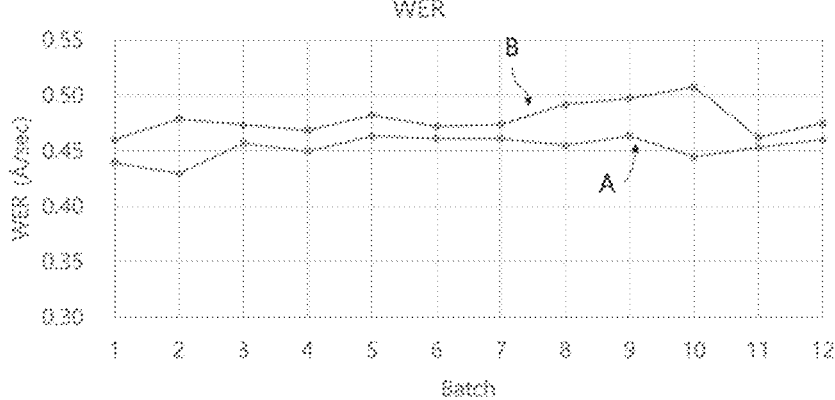
FIG. 5 is a graph showing a trend of a wet etch rate of a film deposited on a substrate after a conventional seasoning process and a seasoning process of the disclosure.

FIG. 5 is a graph showing a wet etch rate (WER) trend of a film deposited on a substrate in accordance with FIG. 1 and FIG. 3. In FIG. 5, a trend graph A is a wet etch rate of a film deposited on a substrate after a conventional seasoning step according to FIG. 1, with a dry cleaning step at the first temperature T1, and a seasoning step and a substrate processing step at the second temperature T2. A trend graph B is a wet etch rate of a film deposited on a substrate after a seasoning process according to FIG. 3, with a seasoning process in accordance with an embodiment of the invention with a dry cleaning process and a first seasoning step at the first temperature T1' and a second seasoning step and a substrate processing step at the second temperature T2'.

In FIG. 5, a gas supplied during the first seasoning step, a gas supplied during the second seasoning step and a gas supplied during a substrate processing step may be the same. In more detail, DCS (dichlorosilane; $SiH_2Cl_2$) gas as a source gas and $NH_3$ plasma as a reactant are supplied, and both gases may be supplied alternately and sequentially to deposit SiN film on the inner surface of the reactor by PEALD method during a seasoning step. The source gas may be further selected from aminosilane and iodosilane such as TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$, HCD, $Si_2Cl_6$, 3DMAS, $SiH(N(Me)_2)_3$; BEMAS, $SiH_2[N(Et)(Me)]_2$; AHEAD, $Si_2(NHEt)_6$, TEAS, $Si(NHEt)_4$; $Si_3H_8$; $SiHI_3$; or $SiH_2I_2$. After the seasoning step is completed, a substrate may be loaded to the heating block and SiN film is deposited thereon. Then the SiN film is wet-etched in 100:1 dHF solution (diluted hydrofluoric acid in deionized water) for certain time, and the wet etch rate of each trend graph may be monitored.

In FIG. 5, 12 batches of substrates may be processed (1 batch is 24 substrates) and the wet etch rate of SiN film deposited on the last substrate of each batch may be monitored whether the wet etch rate of SiN film is within the target range of 0.46 Å/sec to 0.51 Å/sec.

In FIG. 5, the seasoning condition B shows the wet etch rate of SiN film deposited on the substrate may be maintained within the target range, but the seasoning condition A shows the wet etch rate of SiN film deposited on the substrate may be lower than the target range or out of the target range. In the seasoning condition A, the wet etch rate of SiN film may be particularly low in the initial batch in which the accumulated thickness of SiN film is low. Thus, FIG. 5 shows that a seasoning process according to the disclosure, that is, the trend graph B, effectively suppresses cleaning byproducts from spreading in a reactor and prevents a film properties from being deteriorated.

In another embodiment according to the disclosure, a dry cleaning process may be carried out by supplying a fluorine-containing cleaning gas activated by RF power in-situ or remotely or combination thereof. a first seasoning step and a second seasoning step may be carried out by at least one of atomic layer deposition (ALD), plasma atomic layer deposition (PEALD), chemical vapor deposition (CVD), plasma chemical vapor deposition (PECVD), or pulsed plasma chemical vapor deposition or a combination thereof.

In another embodiment, in a first seasoning process and a second seasoning process, $NH_3$ flow rate, $NH_3$ plasma supply time, and $NH_3$ plasma power intensity may increase to promote the reaction with cleaning byproducts, thus cleaning byproducts may be more effectively removed.

In another embodiment, a seasoning process of the disclosure has a technical advantage that suppresses cleaning byproducts from evacuating, spreading and re-spreading in a reactor more effectively; thus wet etch cycle may be extended and the uptime of the apparatus and the efficiency of operating it is improved.

Figure 6:
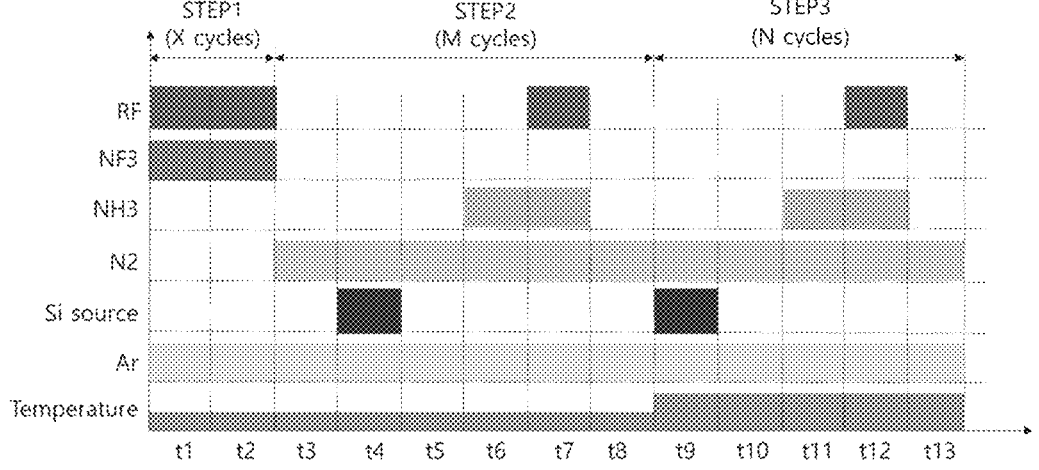
FIG. 6 is a view of a dry cleaning and a seasoning process flow according to an embodiment of the invention.

FIG. 6 illustrates a seasoning process flow of the disclosure. The details of each step of FIG. 6 is as follows.

STEP 1: a dry cleaning step in which an $NF_3$ gas as cleaning gas may be supplied to the reactor maintained at a first temperature and removes SiN films from the inner surface of the reactor. The $NF_3$ gas may be activated by RF power in-situ or remotely. This step may be repeated 'X' times.

STEP 2: a first seasoning step in which a first SiN film as a first seasoning film may be deposited on the inner surface of the reactor. The first seasoning film may be deposited at the first temperature by plasma atomic layer deposition method in which a Si-containing gas and $NH_3$ gas as a reactant are alternately and sequentially; the $NH_3$ gas may be activated by RF power. This step may be repeated 'M' times until the thickness of the first seasoning film, that is, the thickness of the first SiN film, is 80% of the total thickness of the seasoning film, that is, the first seasoning film and the second seasoning film.

STEP 3: a second seasoning step in which the temperature may be raised to the second temperature and a second SiN film as a second seasoning film may be deposited on the first SiN film by plasma atomic layer deposition. The second SiN film is deposited by supplying Si-containing gas and $NH_3$ gas as a reactant are alternately and sequentially, and $NH_3$ gas is activated by RF power. This step is repeated 'N' times until the thickness of the second seasoning film, that is, the thickness of the second SiN film, is 20% of the total thickness of the seasoning film, that is, the first seasoning film and the second seasoning film. The repeated time of the step 3 is less than that of step 2 (N<M).

Table 1 to Table 3 are details of the process condition of the one embodiment.

TABLE 1

| | a dry cleaning process condition | |
| --- | --- | --- |
| Items | | $NF_3$ dry cleaning condition |
| Gas Flow Rate(sccm) | Purge Ar | 1000 to 5000 sccm (Preferably 1000 to 3000 sccm) |
| | $NF_3$ | 1000 to 5000 sccm (Preferably 2000 to 3000 sccm) |
| Cleaning time(sec) | Plasma-on | 300 to 900 sec (preferable 500 to 700 sec) |
| Plasma ignition type | | Remote Plasma |
| Process pressure | | 1 to 10 Torr (preferable 1 to 3 Torr) |
| Process Temp. | | 200 to 600° C. (preferable 325° C. to 375° C.) |

TABLE 2

| | a first seasoning process condition | |
| --- | --- | --- |
| Items | | First seasoning |
| Gas Flow Rate (sccm) | Purge Ar | 7000 to 15000 sccm (preferably 8000 to 10000 sccm) |
| | Reactant $N_2$ | 0 to 5000 sccm (preferably 0 to 2000 sccm) |
| | Reactant $NH_3$ | 1000 to 10000 sccm (preferably 1000 to |

TABLE 2-continued

| | a first seasoning process condition | |
| --- | --- | --- |
| Items | | First seasoning |
| | | 8000 sccm) |
| | Si source | 1000 to 5000 sccm (preferably 1000 to 3000 sccm) |
| Process time (sec) | Source feeding | 0.1 to 3.0 sec (preferably 0.1 to 1.0 sec) |
| | Source purge | 0.1 to 1.0 sec (preferably 0.1 to 0.7 sec) |
| | Reactant feeding | 0.1 to 1.0 sec (preferably 0.1 to 0.7 sec) |
| | Plasma-on | 0.1 to 3.0 sec (preferably 0.1 to 1.0 sec) |
| | Plasma Purge | 0.1 to 1.0 sec (preferably 0.1 to 0.7 sec) |
| Plasma condition | RF Power | 50 to 1500 W (preferably 50 to 500 W) |
| | RF frequency | 13.56 MHz |
| | Ignition type | direct plasma(in-situ) |
| Film Thickness | | 0.1 to 0.5 um (preferably 0.2 to 0.4 um) |
| Process pressure | | 1 to 10 Torr (preferably 3 to 8 Torr) |
| Process Temp. | | 200 to 400° C. (preferably 325° C. to 375° C.) |
| Silicon source | | $SiH_2C_{l2}$ |

TABLE 3

| | a second seasoning process condition | |
| --- | --- | --- |
| Items | | Second seasoning |
| Gas Flow Rate (sccm) | Purge Ar | 7000 to 15000 sccm (Preferably 8000 to 10000 sccm) |
| | Reactant $N_2$ | 0 to 5000 sccm (Preferably 0 to 2000 sccm) |
| | Reactant $NH_3$ | 1000 to 10000 sccm (Preferably 1000 to 8000 sccm) |
| | Si source | 1000 to 5000 sccm (Preferably 1000 to 3000 sccm) |
| Process time (sec) | Source feeding | 0.1 to 3.0 sec (preferably 0.1 to 1.0 sec) |
| | Source purge | 0.1 to 1.0 sec (preferably 0.1 to 0.7 sec) |
| | Reactant feeding | 0.1 to 1.0 sec (preferably 0.1 to 0.7 sec) |
| | Plasma-on | 0.1 to 3.0 sec (preferably 0.1 to 1.0 sec) |
| | Plasma Purge | 0.1 to 1.0 sec (preferably 0.1 to 0.7 sec) |
| Plasma condition | RF Power | 50 to 1500 W (preferably 50 to 500 W) |
| | RF frequency | 13.56 MHz |
| | Ignition type | direct plasma(in-situ) |
| Film Thickness | | 0.02 to 0.1 um (preferably 0.04 to 0.2 um) |
| Process pressure | | 1 to 10 Torr (preferably 3 to 8 Torr) |
| Process Temp. | | 400 to 600° C.(preferably 425° C. to 475° C.) |
| Si source | | $SiH_2Cl_2$ |

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of seasoning process for depositing a film on an inner surface of a reactor comprising:

a dry cleaning step comprising cleaning the inner surface of the reactor by supplying a cleaning gas to the reactor;

a first seasoning step comprising directly depositing a first seasoning film comprising silicon nitride on the inner surface of the reactor by a plasma-enhanced atomic layer deposition (PE-ALD) process or a plasma-enhanced chemical vapor deposition (PE-CVD) process; and a second seasoning step comprising depositing a second seasoning film on the first seasoning film comprising by a plasma-enhanced atomic layer deposition (PE-ALD) process or a plasma-enhanced chemical vapor deposition (PE-CVD) process;

wherein the dry cleaning step and the first seasoning step are carried out at a first temperature, and wherein the second seasoning step is carried out at a second temperature greater than the first temperature, wherein directly depositing the first seasoning film.

2. The method of claim 1, further comprising a step for raising a temperature from the first temperature to the second temperature after the first seasoning step and before the second seasoning step, wherein the first temperature is between 200° C. and 400° C. and the second temperature is between 400° C. and 600° C.

3. The method of claim 2, wherein the first thickness of the first seasoning film is 80% of a total thickness of the first seasoning film and the second seasoning film.

4. The method of claim 2, wherein the first seasoning film suppresses cleaning byproducts generated during the dry cleaning process from evaporating and spreading in the reactor during the raising of the temperature from the first temperature to the second temperature.

5. The method of claim 1, wherein the first seasoning step and the second seasoning step are carried out by a PE-ALD process comprising supplying a source gas and a reactant sequentially and alternately respectively, wherein the first seasoning step is cyclically repeated multiple times until the thickness of the first seasoning film reaches the 80% of the total thickness of the first seasoning film and the second seasoning film, wherein the second seasoning step is cyclically repeated multiple times until the thickness of the second seasoning film reaches the 20% of the total thickness of the first seasoning film and the second seasoning film.

6. The method of claim 5, wherein the reactant is activated by RF power.

7. The method of claim 5, wherein the source gas is a silicon-containing gas and the reactant is an oxygen or a nitrogen-containing gas.

8. The method of claim 7, wherein the silicon-containing gas is at least one of iodosilane, silicon halide, or combination thereof.

9. The method of claim 8, wherein the silicon-containing gas is selected from at least one of: TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N$ (iPr); DSTBA, $(SiH_3)_2N$ (tBu); DEAS, $SiH_3NEt_2$; DTBAS, $SiH_3N$ (tBu)$_2$; BDEAS, $SiH_2(NEt_2)_2$; BDMAS, $SiH_2$ $(NMe_2)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; DCS, $SiH_2Cl_2$; $Si_3H_8$; $SiHI_3$; or $SiH_2I_2$.

10. The method of claim 8, wherein the second seasoning step is carried out to deposit silicon oxide film or silicon nitride film as the second seasoning film on the inner surface of the reactor by PE-ALD.

11. The method of claim 1, wherein the cleaning gas is a fluorine-containing gas activated remotely by a RF power.

12. The method of claim 11, wherein the fluorine-containing gas is at least one of $ClF_3$, or $F_2$ or combination thereof.

13. The method of claim 1, wherein the first temperature is within the range of 325° C. to 375° C. and the second temperature is within the range of 425° C. to 475° C.

14. The method of claim 1, further including a substrate processing step, wherein a substrate is loaded into the reactor and processed at the second temperature.

15. The method of claim 1, wherein the first seasoning step comprises supplying a source gas comprising silicon and a reactant comprising one or more $NH_3$ and $N_2$.

16. The method of claim 15, wherein the second seasoning step comprises supplying the source gas and the reactant.

17. The method of claim 16, wherein the source gas comprises one or more of an, iodosilane and silicon halide.

18. The method of claim 1, wherein the second seasoning step comprises supplying a source gas comprising silicon and a reactant comprising one or more $NH_3$ and $N_2$.

19. The method of claim 1, wherein the second seasoning film comprises silicon nitride.

* * * * *